(12) United States Patent
Zhen

(10) Patent No.: US 9,741,637 B2
(45) Date of Patent: Aug. 22, 2017

(54) ELECTRONIC DEVICE HAVING A HEAT DISSIPATION UNIT AND METHOD OF MANUFACTURING AN ELECTRONIC DEVICE

(71) Applicant: Lenovo (Beijing) Limited, Beijing (CN)

(72) Inventor: Qingjuan Zhen, Beijing (CN)

(73) Assignee: Lenovo (Beijing) Limited, Beijing (CN)

( * ) Notice: Subject to any disclaimer, the term of this patent is extended or adjusted under 35 U.S.C. 154(b) by 0 days.

(21) Appl. No.: 14/997,101

(22) Filed: Jan. 15, 2016

(65) Prior Publication Data

US 2017/0117207 A1  Apr. 27, 2017

(30) Foreign Application Priority Data

Oct. 23, 2015  (CN) .......................... 2015 1 0696093

(51) Int. Cl.
| | | |
|---|---|---|
| H01L 23/00 | (2006.01) | |
| H01L 23/373 | (2006.01) | |
| H01L 21/48 | (2006.01) | |
| H01L 23/367 | (2006.01) | |

(52) U.S. Cl.
CPC ...... H01L 23/3735 (2013.01); H01L 21/4882 (2013.01); H01L 23/367 (2013.01); *H01L 2225/06589* (2013.01)

(58) Field of Classification Search
CPC ......... H01L 2225/06589; H01L 23/367; H01L 23/3735
See application file for complete search history.

(56) References Cited

U.S. PATENT DOCUMENTS

| | | | | |
|---|---|---|---|---|
| 2007/0216273 A1* | 9/2007 | Yanagawa | .......... | H05K 7/20972 313/46 |
| 2011/0260096 A1* | 10/2011 | Atarashi | ................ | C08J 9/0061 252/73 |
| 2012/0087088 A1* | 4/2012 | Killion | ................ | F28D 15/0266 361/697 |
| 2012/0168632 A1* | 7/2012 | Yagi | ..................... | A61B 6/4233 250/366 |
| 2014/0049984 A1* | 2/2014 | Chen | ..................... | F21V 29/002 362/611 |
| 2014/0069622 A1* | 3/2014 | Chen | ........................ | A61B 6/10 165/185 |
| 2015/0152569 A1* | 6/2015 | Okada | ..................... | C30B 29/36 117/28 |
| 2015/0206820 A1* | 7/2015 | Standing | ............... | H01L 23/367 257/717 |

* cited by examiner

*Primary Examiner* — Ngan Ngo

(74) *Attorney, Agent, or Firm* — Ference & Associates LLC

(57) ABSTRACT

An embodiment discloses an electronic device, including: a processing component; and a heat dissipation unit thermally coupled to the processing component, the heat dissipation unit comprising: a first thermal conductive layer that directs heat that is generated by the processing component away from the processing component in a first direction, and a second layer disposed in relation to the first thermal conductive layer, where the second layer has a lower thermal conductivity as compared with the first thermal conductive layer in the first direction. Other aspects are described and claimed.

20 Claims, 2 Drawing Sheets

ELECTRONIC DEVICE HAVING A HEAT DISSIPATION UNIT AND METHOD OF MANUFACTURING AN ELECTRONIC DEVICE

CLAIM FOR PRIORITY

This application claims priority to Chinese Application No. 201510696093.0, filed on Oct. 23, 2015, which is fully incorporated by reference herein.

FIELD

The subject matter described herein relates to the heat dissipation technology of an electronic device, in particular to a heat dissipation unit and an electronic device.

BACKGROUND

With the development of communication technology, terminals and other electronic devices have become an indispensable part in daily life; moreover, users have more and more diversified requirements on the electronic device, for example, ultralight and ultrathin notebook computers are increasingly favored by the users. At present, the ultralight and ultrathin notebook computers often adopt a fan-less (fan-less) design for heat dissipation, and meanwhile, the overall weights of the ultralight and ultrathin notebook computers can be reduced.

BRIEF SUMMARY

In summary, one aspect provides an electronic device, comprising: a processing component; and a heat dissipation unit thermally coupled to the processing component, the heat dissipation unit comprising: a first thermal conductive layer that directs heat that is generated by the processing component away from the processing component in a first direction, and a second layer disposed in relation to the first thermal conductive layer, and wherein the second layer has a lower thermal conductivity as compared with the first thermal conductive layer in the first direction.

Another aspect provides a heat dissipation unit, comprising: a first thermal conductive layer that directs heat in a first direction, and a second layer disposed in relation to the first thermal conductive layer, and wherein the second layer has a lower thermal conductivity as compared with the first thermal conductive layer in the first direction.

A further aspect provides a method of manufacturing an electronic device, comprising: arranging a first thermal conductive layer thermally coupled to a processing unit to direct away heat that is generated from the processing unit in a first direction; and arranging a second layer with respect to the first thermal conductive layer, wherein the second layer has a lower thermal conductivity as compared the first thermal conductive layer in the first direction.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

DETAILED DESCRIPTION

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

With respect to the heat dissipation unit provided by embodiments applied to an electronic device, the heat dissipation unit at least comprises a first material layer and a second material layer; wherein, the first material layer is located between the processing component and the second material layer, and is used for absorbing heat generated by the processing component; the processing component is located in the electronic device; the second material layer has a lower thermal conductivity in a first direction than that in a second direction; and wherein, the first direction is a direction pointing from the processing component to the first material layer. Therefore, the arranged second material layer can prevent the heat absorbed by the first material layer from being transmitted in the first direction (the perpendicular direction), correspondingly, a high surface temperature of the electronic device provided with the heat dissipation unit can be reduced, the user experience can be improved, and the normal operation of the electronic device can also be guaranteed; and in addition, due to the arrangement of the second material layer, the first material layer can be closer to a heat source (the processing component), namely, the first material layer absorbs more heat.

Embodiment 1

Figure 1:
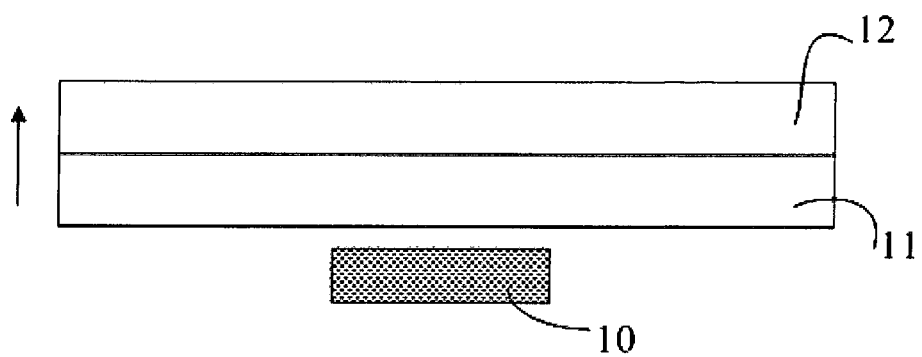
FIG. 1 is a first schematic diagram of a structure of the heat dissipation unit in accordance with an embodiment.

An embodiment provides a heat dissipation unit applied to an electronic device, wherein as shown in FIG. 1, the heat dissipation unit at least comprises a first thermal conductive layer (e.g., a first material layer 11) and a second layer (e.g., a second material layer 12); wherein, the first material layer 11 is located between a processing unit (e.g., a processing component 10) and the second material layer 12, and is used for absorbing heat generated by the processing component 10; the processing component 10 is located in the electronic device; the second material layer 12 has a lower thermal conductivity in a first direction than that in a second direction, so that the heat absorbed by the first material layer can be prevented from being transmitted in the first direction; wherein, the first direction is a direction pointing from the processing component 10 to the first material layer 11, and illustratively, the first direction is shown by an arrow in FIG. 1. The second direction can be any other direction different from the first direction.

Preferably, in a preparation process, the second material layer can be directly deposited on the first material layer. Since the second material layer can prevent the heat absorbed by the first material layer from being transmitted in the first direction (the direction perpendicular to the planar structure of the first material layer 11) towards a user (e.g. the user's fingers resting on a keyboard of the electronic device), the embodiment enhances user comfort during use of the electronic device. The first material layer can be arranged to be close to the processing component, and a certain gap can be reserved between the first material layer and the processing component, as shown in FIG. 1, or the first material layer can also touch the processing component, for example, being adhered together.

In an embodiment, the processing component 10 in the electronic device can be a central processing unit (CPU), a display card, a chipset, an optical disc drive or a hard disk, etc. The processing component will generate a lot of heat in an operation process, which not only affects the normal operation of the electronic device, but also user experience.

In an embodiment, the first material layer is composed of a high thermal conductivity material, and the material can be an anisotropic material; and the high thermal conductivity material is a material with thermal conductivity greater than that of a first medium.

Preferably, the high thermal conductivity material is a material with a high thermal conductivity coefficient, for example, a metallic material, or a non-metallic material or a high molecular material or the like, which can comprise aluminum, gold, copper, iron, magnesium, silver or stainless steel or a mixture of two or more of the above metals; or is graphite, a carbon nanotube or a high molecular compound or a mixture of two or more of the above nonmetals. Since the thermal conductivity coefficient is high, the first material layer can quickly absorb the heat at the processing component to achieve the purpose of lowering the temperature of the environment around the processing component. The first medium is the environment where the processing component is located, and is air in general.

In an embodiment, the second material layer is composed of a thermal insulation material; and the thermal insulation material is a material with thermal conductivity smaller than that of the first medium.

Preferably, the thermal insulation material is a material capable of blocking thermal flow transmission, which is also called a thermal insulating material. A traditional thermal insulation material can be glass fiber, asbestos, rock wool, or silicate and the like; and a novel thermal insulation material can be an aerogel felt or a vacuum plate and the like. If the types of the thermal insulation materials are different, the thermal conductivity coefficients are different; if the material constructions of the thermal insulation materials are different, the physical and thermal properties thereof are different; and if the thermal insulation mechanisms are different, the heat-conducting properties or the thermal conductivity coefficients thereof are different. Therefore, corresponding thermal insulation materials can be selected according to actual cost, material property and other factors in practical application.

In an embodiment, the second material layer is arranged on the first material layer, the second material layer prevents the heat absorbed by the first material layer from being transmitted in the first direction (the perpendicular direction), so that the problem of a high surface temperature of the electronic device can be reduced, and the user experience can be improved. In addition, due to the arrangement of the second material layer, the first material layer can be closer to a heat source (the processing component), namely, the first material layer absorbs more heat.

Embodiment 2

Figure 2:
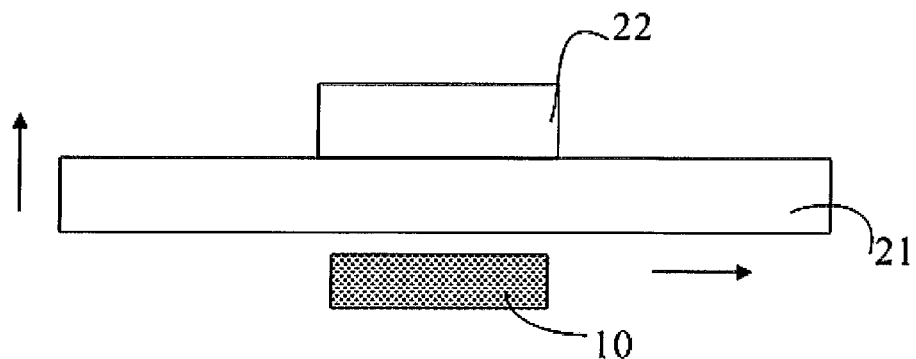
FIG. 2 is a second schematic diagram of a structure of the heat dissipation unit in accordance with an embodiment.

An embodiment provides a heat dissipation unit applied to an electronic device, wherein as shown in FIG. 2, the heat dissipation unit at least comprises a first material layer 21 and a second material layer 22, and the surface area of the second material layer 22 is smaller than that of the first material layer 21; wherein, the first material layer 21 is located between a processing component and the second material layer 22, and is used for absorbing heat generated by the processing component 10; the processing component 10 is located in the electronic device; the second material layer 22 has a lower thermal conductivity in a first direction than that in a second direction, so that the heat absorbed by the first material layer can be prevented from being transmitted in the first direction; wherein, the first direction is a direction pointing from the processing component 10 to the first material layer 21, and illustratively, the first direction is shown by an arrow in a vertical direction in FIG. 2. The second direction can be any other direction different from the first direction.

Preferably, in a preparation process, the material of the second material layer 22 can be directly deposited on the first material layer 21, and then the structure of the second material layer 22 is obtained by carrying out exposure, etching and other techniques via a mask. Since the second material layer 22 can prevent the heat absorbed by the first material layer 21 from being transmitted in the first direction towards a user (e.g., the user's fingers resting on a keyboard of the electronic device), the embodiment enhances user comfort during use of the electronic device. The first material layer 21 can be arranged to be close to the processing component, and a certain gap can be reserved between the first material layer and the processing component, as shown in FIG. 2, or the first material layer can also touch the processing component, for example, being adhered together.

In an embodiment, the processing component 10 in the electronic device can be a central processing unit (CPU), a display card, a chipset, an optical disc drive or a hard disk, etc. The processing component will generate a lot of heat in an operation process, which not only influences the normal operation of the electronic device, but also reduces the user experience.

In an embodiment, the first material layer is composed of a high thermal conductivity material, and the material can be an anisotropic material; and the high thermal conductivity material is a material with thermal conductivity greater than that of a first medium.

Preferably, the high thermal conductivity material is a material with a high thermal conductivity coefficient, for example, a metallic material, or a non-metallic material or a high molecular material or the like, which can comprise aluminum, gold, copper, iron, magnesium, silver or stainless steel or a mixture of two or more of the above metals; or is graphite, a carbon nanotube or a high molecular compound or a mixture of two or more of the above nonmetals. Since the thermal conductivity coefficient is high, the first material layer can quickly absorb the heat at the processing component to achieve the purpose of lowering the temperature of the processing component. The first medium is an environment where the processing component is located, and is air in general.

In an embodiment, the second material layer is composed of a thermal insulation material; and the thermal insulation material is a material with thermal conductivity smaller than that of the first medium.

Preferably, the thermal insulation material is a material capable of blocking thermal flow transmission, which is also called a thermal insulating material. A traditional thermal insulation material can be glass fiber, asbestos, rock wool, or silicate and the like; and a novel thermal insulation material can be an aerogel felt or a vacuum plate and the like. If the types of the thermal insulation materials are different, the thermal conductivity coefficients are different; if the material constructions of the thermal insulation materials are different, the physical and thermal properties thereof are different; and if the thermal insulation mechanisms are different, the heat-conducting properties or the thermal conductivity coefficients thereof are different. Therefore, corresponding thermal insulation materials can be selected according to actual cost, material property and other factors in practical application.

In an embodiment, the surface area of the second material layer 22 can be configured based on the surface area of the processing component 10. As shown in FIG. 2, the surface area of the second material layer 22 can be equivalent to that of the processing component 10 or slightly greater than that of the processing component 10, and the purpose lies in preventing the heat absorbed by the first material layer 21 at a position relative to the second material layer 22, and from being transmitted in the first direction towards a user.

However, the surface area of the first material layer 21 may also be reduced to save on production costs and the internal space of the electronic device to achieve an ultrathin setting requirement of the electronic device.

In an embodiment, the second material layer is further used for enabling the first material layer to transmit the absorbed heat in a third direction; and wherein, the third direction is perpendicular to the first direction. The third direction is shown by an arrow in the horizontal direction in FIG. 2.

In an embodiment, due to the blockage of the second material layer, the heat absorbed by the first material layer cannot be transmitted in the first direction, and the heat is transmitted in the first material layer along the second and third directions. In other words, the heat is prevented from being transmitted in the first direction, and the heat is instead transmitted to the outside of the electronic device along the horizontal second and third directions away from the user, so as to reduce the surface temperature of the electronic device to improve the user experience.

Embodiment 3

Figure 3:
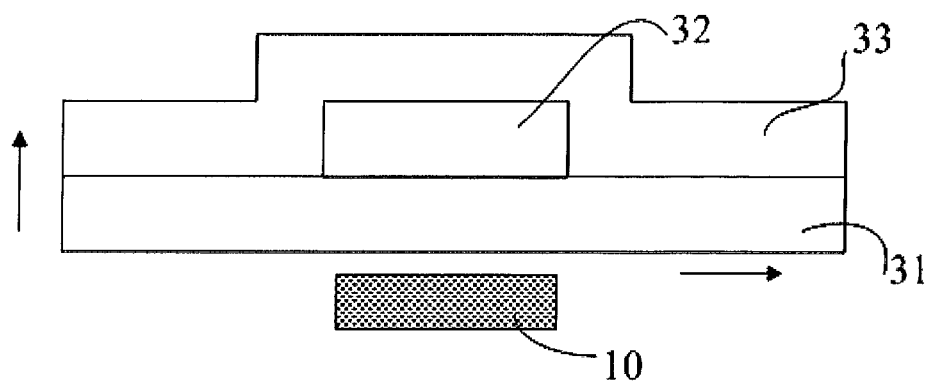
FIG. 3 is a third schematic diagram of a structure of the heat dissipation unit in accordance with an embodiment.

An embodiment provides a heat dissipation unit applied to an electronic device, wherein as shown in FIG. 3, the heat dissipation unit at least comprises a first material layer 31, a second material layer 32 and a third material layer 33, and the surface area of the second material layer 32 is smaller than that of the first material layer 31; wherein, the first material layer 31 is located between a processing component and the second material layer 32, and is used for absorbing heat generated by the processing component 10; the processing component 10 is located in the electronic device; the second material layer 32 has a lower thermal conductivity in a first direction than that in a second direction, so that the heat absorbed by the first material layer can be prevented from being transmitted in the first direction; wherein, the first direction is a direction pointing from the processing component 10 to the first material layer 31, and illustratively, the first direction is shown by an arrow in a vertical direction in FIG. 3. The second direction can be any other direction different from the first direction; the third material layer 33 comprises a first part and a second part; wherein, the first part has a substantially similar surface area as that of the second material layer 32, and projections of the first part and the second material layer 32 are substantially overlapped on a horizontal plane perpendicular to the first direction; and the third material layer 33 is used for absorbing the heat of the first material layer.

Preferably, in a preparation process, the material of the second material layer 32 is directly deposited on the first material layer 31, and then the structure of the second material layer 32 is obtained by carrying out exposure, etching and other techniques via a mask; and then, a material corresponding to the third material layer 33 is deposited on the second material layer, and the third material layer 33 completely covers the second material layer 32 and parts of the first material layer 31 that is not covered by the second material layer 32, as shown in FIG. 3. Illustratively, since the second material layer 32 can prevent the heat absorbed by the first material layer 31 from being transmitted in the first direction (the perpendicular direction), the first material layer 31 can be arranged to be close to the processing component, and a certain gap can be reserved between the first material layer and the processing component, as shown in FIG. 3; or, the first material layer 31 can also touch the processing component, for example, being adhered together.

In an embodiment, the processing component 10 in the electronic device can be a central processing unit (CPU), a display card, a chipset, an optical disc driver or a hard disc, etc. The processing component will generate a lot of heat in an operation process, which not only influences the normal operation of the electronic device, but also reduces the user experience.

In an embodiment, the first material layer is composed of a high thermal conductivity material, and the material can be an anisotropic material; and the high thermal conductivity material is a material with thermal conductivity greater than that of a first medium.

Preferably, the high thermal conductivity material is a material with a high thermal conductivity coefficient, for example, a metallic material, or a non-metallic material or a high molecular material or the like, which can comprise aluminum, gold, copper, iron, magnesium, silver or stainless steel or a mixture of two or more of the above metals; or is graphite, a carbon nanotube or a high molecular compound or a mixture of two or more of the above nonmetals. Since the thermal conductivity coefficient is high, the first material layer can quickly absorb the heat at the processing component to achieve the purpose of lowering the temperature of the processing component. The first medium is an environment where the processing component is located, and is air in general.

In an embodiment, the second material layer is composed of a thermal insulation material; and the thermal insulation material is a material with thermal conductivity smaller than that of the first medium.

Preferably, the thermal insulation material is a material capable of blocking thermal flow transfer, which is also called a thermal insulating material. A traditional thermal insulation material can be glass fiber, asbestos, rock wool, or silicate and the like; and a novel thermal insulation material can be an aerogel felt or a vacuum plate, etc. If the types of the thermal insulation materials are different, the thermal conductivity coefficients are different; if the material constructions of the thermal insulation materials are different, the physical and thermal properties thereof are different; and if the thermal insulation mechanisms are different, the heat-conducting properties or the thermal conductivity coefficients thereof are different. Therefore, corresponding thermal insulation materials can be selected according to actual cost, material property and other factors in practical application.

Preferably, the third material layer 33 is composed of a high thermal conductivity material; and the high thermal conductivity material is a material with thermal conductivity greater than that of the first medium.

In an embodiment, the high thermal conductivity material selected by the third material layer can be the same as the high thermal conductivity material of the first material layer, or a different high thermal conductivity material is selected. For example, the first material layer selects a metallic material, such as aluminum, gold, copper, iron, magnesium, silver or stainless steel or a mixture of two or more of the above metals; the third material layer selects a non-metallic material, for example, graphite; or, both of the first material layer and the third material layer are of metallic materials, but are different kinds of metallic materials; or, both of the first material layer and the third material layer are of different kinds of non-metallic materials or high molecular materials, and a variety of implementation manners can be adopted according to actual demand.

In an embodiment, due to the arrangement of the third material layer, the transmission of the heat in the horizontal direction can be accelerated, specifically, the second material layer blocks the heat absorbed by the first material layer 31, the second part of the third material layer 33 on the first material layer further absorbs the heat absorbed by the first material layer 31, to disperse the heat sideway from the two material layers, to lower the temperature of the electronic device.

Preferably, the area of the second material layer 32 can be configured based on the surface area of the processing component 10. As shown in FIG. 3, the area of the second material layer 32 can be equivalent to that of the processing component 10 or slightly greater than that of the processing component 10, and the purpose lies in that preventing the heat absorbed by the first material layer 31 at a position relative to the second material layer 32, and preventing the heat from being transmitted in the first direction. It should be appreciated that the surface area of the first material layer 31 may be correspondingly reduced to save production costs, and the internal space of the electronic device to meet an ultrathin setting requirement of the electronic device.

In an embodiment, the second material layer is further used for enabling the first material layer to transmit the absorbed heat in a third direction; and wherein, the third direction is perpendicular to the first direction. The third direction is shown by an arrow in the horizontal direction in FIG. 3.

In an embodiment, due to the blockage of the second material layer, the heat absorbed by the first material layer cannot be transmitted in the first direction, and the heat is transmitted in the first material layer along the second and third directions. In other words, the heat is prevented from being transmitted in the first direction, and instead more heat is transmitted to the outside of the electronic device along the horizontal second and third directions, so as to reduce the surface temperature of the electronic device to improve the user experience.

In an embodiment, the second material layer is arranged on the first material layer, the second material layer prevents the heat absorbed by the first material layer from being transmitted in the first direction (the perpendicular direction), so that the problem of a high surface temperature of the electronic device can be reduced, and the user experience can be improved; in addition, due to the blockage of the second material layer, the heat absorbed by the first material layer cannot be transmitted in the first direction, and the heat is transmitted in the first material layer along the third direction under compulsion, so that the surface temperature of the electronic device can also be lowered; in addition, due to the arrangement of the second material layer, the first material layer can be closer to a heat source (the processing component), namely, the first material layer absorbs more heat; and moreover, on the premise of not influencing the thermal insulation effect, the area of the first material layer can be correspondingly reduced to save the production cost, and save the internal space of the corresponding electronic device to conveniently meet the ultrathin setting requirement of the electronic device.

In addition, due to the arrangement of the third material layer, the transmission of the heat absorbed by the first material layer in the horizontal direction can be accelerated, and correspondingly, the transmission possibility of the heat in the perpendicular direction can be further reduced to lower the surface temperature of the electronic device.

Embodiment 4

Figure 4:
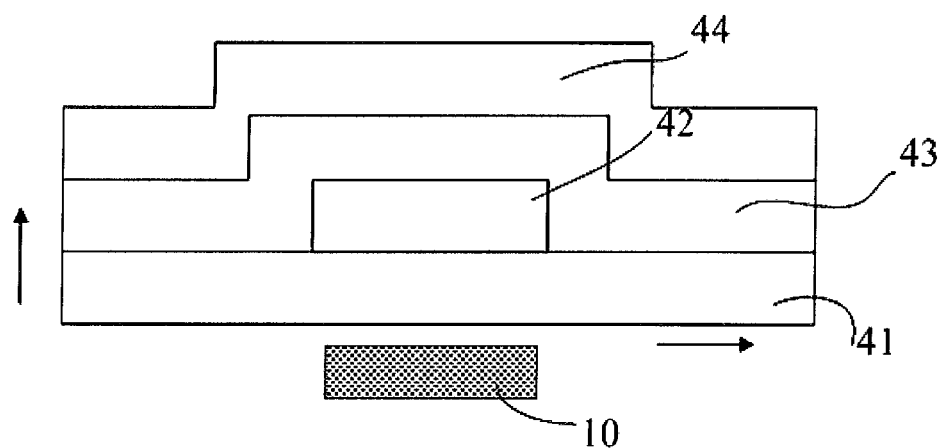
FIG. 4 is a fourth schematic diagram of a structure of the heat dissipation unit in accordance with an embodiment.

An embodiment provides a heat dissipation unit applied to an electronic device, wherein as shown in FIG. 4, the heat dissipation unit comprises a first material layer 41, a second material layer 42, a third material layer 43 and a fourth material layer 44, and the area of the second material layer 42 is smaller than that of the first material layer 41; wherein, the first material layer 41 is located between a processing component and the second material layer 42, and is used for absorbing heat generated by the processing component 10; the processing component 10 is located in the electronic device; the second material layer 42 has a lower thermal conductivity in a first direction than that in a second direction, so that the heat absorbed by the first material layer can be prevented from being transmitted in the first direction; wherein, the first direction is a direction pointing from the processing component 10 to the first material layer 41, and illustratively, the first direction is shown by an arrow in a vertical direction in FIG. 4; the second direction can be any other direction different from the first direction; the third material layer 43 comprises a first part and a second part; wherein, the first part has a substantially similar surface area as that of the second material layer 42, and projections of the first part and the second material layer 42 are substantially overlapped on a horizontal plane perpendicular to the first direction; the third material layer 43 is used for absorbing the heat of the first material layer; and the fourth material layer 44 has a lower thermal conductivity in the first direction than that in the second direction, so that the heat absorbed by the third material layer can be prevented from being transmitted in the first direction.

Preferably, in a preparation process, the material of the second material layer 42 can be directly deposited on the first material layer 41, and then the structure of the second material layer 42 is obtained by carrying out exposure, etching and other techniques via a mask; then, a material corresponding to the third material layer 43 is deposited on the second material layer, and the third material layer 43 completely covers the second material layer 42 and parts of the first material layer 41 that is not covered by the second material layer 42, as shown in FIG. 4; the preparation method of the fourth material layer 44 is the same as the preparation method of the second material layer 42, namely, a material of the fourth material layer 44 can be directly deposited on the third material layer 43, and then the structure of the fourth material layer 44 is obtained by carrying out exposure, etching and other techniques via the mask. Illustratively, since the second material layer 42 can prevent the heat absorbed by the first material layer 41 from being transmitted in the first direction (the perpendicular direction), the first material layer 41 can be arranged to be close to the processing component, and a certain gap can be reserved between the first material layer and the processing component, as shown in FIG. 4; or, the first material layer 41 can also touch the processing component, for example, being adhered together.

In an embodiment, the processing component 10 in the electronic device can be a central processing unit (CPU), a display card, a chipset, an optical disc driver or a hard disc, etc. The processing component will generate a lot of heat in an operation process, which not only influences the normal operation of the electronic device, but also reduces the user experience.

In an embodiment, the first material layer is composed of a high thermal conductivity material, and the material can be an anisotropic material; and the high thermal conductivity material is a material with thermal conductivity greater than that of a first medium.

Preferably, the high thermal conductivity material is a material with a high thermal conductivity coefficient, for example, a metallic material, or a non-metallic material or a high molecular material or the like, which can comprise aluminum, gold, copper, iron, magnesium, silver or stainless steel or a mixture of two or more of the above metals; or is graphite, a carbon nanotube or a high molecular compound or a mixture of two or more of the above nonmetals. Since the thermal conductivity coefficient is high, the first material layer can quickly absorb the heat at the processing component to achieve the purpose of lowering the temperature of the processing component. The first medium is an environment where the processing component is located, and is air in general.

In an embodiment, the second material layer is composed of a thermal insulation material; and the thermal insulation material is a material with thermal conductivity smaller than that of the first medium.

Preferably, the thermal insulation material is a material capable of blocking thermal flow transmission, which is also called a thermal insulating material. A traditional thermal insulation material can be glass fiber, asbestos, rock wool, or silicate and the like; and a novel thermal insulation material can be an aerogel felt or a vacuum plate and the like. If the types of the thermal insulation materials are different, the thermal conductivity coefficients are different; if the material constructions of the thermal insulation materials are different, the physical and thermal properties thereof are different; and if the thermal insulation mechanisms are different, the heat-conducting properties or the thermal conductivity coefficients thereof are different. Therefore, corresponding thermal insulation materials can be selected according to actual cost, material property and other factors in practical application.

In an embodiment, the area of the second material layer 42 can be set based on the area of the processing component 10. As shown in FIG. 4, the area of the second material layer 42 can be equivalent to that of the processing component 10 or slightly greater than that of the processing component 10, and the purpose lies in preventing the heat absorbed by the first material layer 41 at a position relative to the second material layer 42, and preventing the heat from being transmitted in the first direction. Therefore, on the premise of not influencing the thermal insulation effect, the area of the first material layer 41 can be correspondingly reduced to save the production cost, and save the internal space of the corresponding electronic device to conveniently meet the ultrathin setting requirement of the electronic device.

In an embodiment of the present invention, the second material layer is further used for enabling the first material layer to transmit the absorbed heat in a third direction; and wherein, the third direction is perpendicular to the first direction. The third direction is shown by an arrow in the horizontal direction in FIG. 4.

In an embodiment, due to the blockage of the second material layer, the heat absorbed by the first material layer cannot be transmitted in the first direction, and the heat is transmitted in the first material layer along the third direction under compulsion, namely, the heat is prevented from being transmitted in the perpendicular direction, and more heat is transmitted to the outside of the electronic device along the horizontal direction under compulsion, so as to reduce the surface temperature of the electronic device and improve the user experience.

In an embodiment, the third material layer is composed of a high thermal conductivity material; and the high thermal conductivity material is a material with thermal conductivity greater than that of the first medium.

Preferably, the high thermal conductivity material selected by the third material layer can be the same as the high thermal conductivity material of the first material layer, or a different high thermal conductivity material is selected. For example, for the first material layer, a metallic material is selected, such as aluminum, gold, copper, iron, magnesium, silver or stainless steel or a mixture of two or more of the above metals; for the third material layer, a non-metallic material is selected, for example, graphite; or, both of the first material layer and the third material layer are metallic materials, but are different kinds of metallic materials; or, both of the first material layer and the third material layer are different kinds of non-metallic materials or high molecular materials, and a variety of implementation manners can be adopted according to actual demand.

In an embodiment, due to the arrangement of the third material layer, the transmission of the heat absorbed by the first material layer in the horizontal direction can be accelerated, specifically, the second material layer blocks the heat absorbed by the first material layer, the second part of the third material layer covered on the first material layer further absorbs the heat absorbed by the first material layer, and the heat is dispersed outwards from the two material layers, so that the heat dissipation speed can be correspondingly accelerated to lower the temperature of the electronic device.

In an embodiment, the fourth material layer is composed of a thermal insulation material; and the thermal insulation material is a material with thermal conductivity smaller than that of the first medium.

Preferably, the selected thermal insulation material of the fourth material layer may be the same as or different from the thermal insulation material of the second material layer. For example, for the second material layer, a traditional thermal insulation material is selected, such as glass fiber, asbestos, rock wool, or silicate or a mixture of two or more of the above materials; while for the fourth material layer, a new insulation material is selected, for example, an aerogel blanket or a vacuum plate; or, both of the second material layer and the fourth material layer are traditional thermal insulation materials, but are different kinds of traditional thermal insulation materials; or, both of the second material layer and the fourth material layer are different kinds of new thermal insulation materials, etc., and a variety of implementation manners can be adopted according to actual demand.

Illustratively, as shown in FIG. 4, the fourth material layer 44 fully covers the third material layer 43. Of course, the area of the fourth material layer 44 can be suitably reduced according to actual demand. Due to the arrangement of the fourth material layer, the heat absorbed by the third material layer can be prevented from being transmitted in a first direction (the perpendicular direction), particularly, after the third material layer absorbs the heat absorbed by the first material layer, the heat will be transmitted in various directions, so that by arranging the fourth material layer 44, the heat absorbed by the third material layer 43 can be prevented from being transmitted in the first direction, thus not only accelerating the diffusion of the heat in a third direction (horizontal direction), but also preventing the transmission of the heat in the first direction, and reducing the surface temperature of the electronic device.

Embodiments only schematically illustrate several structures of the heat dissipation unit. In practical use, a composite film including multiple (four and more) material layers can be arranged according to the demand.

In embodiments, the second material layer is arranged on the first material layer, the second material layer prevents the heat absorbed by the first material layer from being transmitted in the first direction (the perpendicular direction), so that the problem of a high surface temperature of the electronic device can be reduced, and the user experience can be improved; in addition, due to the blockage of the second material layer, the heat absorbed by the first material layer cannot be transmitted in the first direction, and the heat is transmitted in the first material layer along the third direction under compulsion, also reducing the surface temperature of the electronic device; in addition, due to the arrangement of the second material layer, the first material layer can be closer to a heat source (the processing component), namely, the first material layer absorbs more heat; and on the premise of not influencing the thermal insulation effect, the area of the first material layer can be correspondingly reduced to save the production cost, and save the internal space of the corresponding electronic device to conveniently meet the ultrathin setting requirement of the electronic device.

In addition, due to the arrangement of the third material layer, the transmission of the heat absorbed by the first material layer in the horizontal direction can be accelerated, and due to the arrangement of the fourth material layer, the heat absorbed by the third material layer can be further prevented from being transmitted in the first direction, namely, the transmission possibility of the heat in the perpendicular direction can be further reduced to lower the surface temperature of the electronic device.

Embodiment 5

An embodiment also provides an electronic device, the electronic device being provided with a heat dissipation unit of any of the preceding embodiments. The heat dissipation unit is arranged in a first area of the electronic device for performing heat dissipation on a processing component in the electronic device. The first area can be a component generating relatively higher heat in the electronic device, for example, a CPU, a display card, a chipset, an optical disc drive or a hard disk, etc. Of course, the heat dissipation unit can be respectively arranged on the various parts generating relatively higher heat.

As described herein, the electronic device may be implemented in various forms. For example, terminals described herein may include mobile terminals such as mobile phones, smart phones, notebook computers, digital broadcast receivers, PDAs (Personal Digital Assistants), PADs, PMPs (Portable Media Players) and navigation devices and fixed terminals such as digital TVs and desk computers.

In the context of this document, a storage medium is not a signal and "non-transitory" includes all media except signal media.

As used herein, the singular "a" and "an" may be construed as including the plural "one or more" unless clearly indicated otherwise.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

The invention claimed is:

1. An electronic device, comprising:
    a processing component; and
    a heat dissipation unit thermally coupled to the processing component, the heat dissipation unit comprising:
        a first thermal conductive layer that directs heat that is generated by the processing component away from the processing component in a first direction, and a second layer disposed in relation to the first thermal conductive layer, wherein the first direction is away from the processing component and towards the second layer;
        wherein the second layer has a lower thermal conductivity as compared with the first thermal conductive layer in the first direction and acts to spread heat laterally in a second direction;
        whereby a high surface temperature of the electronic device is reduced.

2. The electronic device of claim 1, wherein the first thermal conductive layer comprises a high thermal conductivity material having a thermal conductivity greater than a thermal conductivity of a first medium substantially surrounding the heat dissipation unit.

3. The electronic device of claim 2, wherein the second layer has a thermal conductivity less than a thermal conductivity of the first medium.

4. The electronic device of claim 1, wherein the second layer has an area that is smaller than an area of the first thermal conductive layer.

5. The electronic device of claim 1, wherein the second layer has an area that is larger than an area of the first thermal conductive layer.

6. The electronic device of claim 1, wherein an area of the second layer is based on an area of the processing component.

7. The electronic device of claim 1, wherein the second layer enables the first thermal conductive layer to transmit absorbed heat in a second direction perpendicular to the first direction.

8. The electronic device of claim 4, comprising a third material layer having a first part and a second part, wherein the second part is arranged on the second layer;
wherein an area of the first part is the same as the area of the second layer, and projections of the first part and the second material layer are overlapped in a plane perpendicular to the first direction; and
wherein the third layer absorbs heat from the first thermal conductive layer.

9. The electronic device of claim 8, wherein the third layer comprises a high thermal conductivity material having a greater thermal conductivity as compared with a first medium substantially surrounding the heat dissipation unit.

10. The electronic device of claim 9, wherein the heat dissipation unit is arranged in a first area of the electronic device to perform heat dissipation on the processing component.

11. A heat dissipation unit, comprising:
a first thermal conductive layer that directs heat in a first direction, and a second layer disposed in relation to the first thermal conductive layer, wherein the first direction is away from a processing component and towards the second layer,
wherein the second layer has a lower thermal conductivity as compared with the first thermal conductive layer in the first direction and acts to spread heat laterally in a second direction;
whereby a high surface temperature of an electronic device is reduced.

12. The heat dissipation unit of claim 11, wherein the first thermal conductive layer comprises a high thermal conductivity material having a thermal conductivity greater than a thermal conductivity of a first medium substantially surrounding the heat dissipation unit.

13. The heat dissipation unit of claim 12, wherein the second layer has a thermal conductivity less than a thermal conductivity of the first medium.

14. The heat dissipation unit of claim 11, wherein the second layer has an area that is smaller than an area of the first thermal conductive layer.

15. The heat dissipation unit of claim 11, wherein:
the first thermal conductive layer is thermally coupled to a processing component; and
an area of the second layer is based on an area of the processing component.

16. The heat dissipation unit of claim 11, wherein the second layer enables the first thermal conductive layer to transmit absorbed heat in a second direction perpendicular to the first direction.

17. The heat dissipation unit of claim 14, comprising a third material layer having a first part and a second part, wherein the second part is arranged on the second layer;
wherein an area of the first part is the same as the area of the second layer, and projections of the first part and the second material layer are overlapped in a plane perpendicular to the first direction; and
wherein the third layer absorbs heat from the first thermal conductive layer.

18. The heat dissipation unit of claim 17, wherein the third layer comprises a high thermal conductivity material having a greater thermal conductivity as compared with a first medium substantially surrounding the heat dissipation unit.

19. The heat dissipation unit of claim 18, wherein the heat dissipation unit is arranged in a first area of the electronic device to perform heat dissipation on the processing component.

20. A method of manufacturing an electronic device, comprising:
arranging a first thermal conductive layer thermally coupled to a processing unit to direct away heat that is generated from the processing unit in a first direction, wherein the first direction is away from the processing component and towards a second layer; and
arranging the second layer with respect to the first thermal conductive layer,
wherein the second layer has a lower thermal conductivity as compared with the first thermal conductive layer in the first direction and acts to spread heat laterally in a second direction;
whereby a high surface temperature of the electronic device is reduced.

* * * * *